(12) United States Patent
Luo et al.

(10) Patent No.: US 11,128,946 B2
(45) Date of Patent: Sep. 21, 2021

(54) HEARING DEVICE WITH ACOUSTIC SHOCK CONTROL AND METHOD FOR ACOUSTIC SHOCK CONTROL IN A HEARING DEVICE

(71) Applicant: Sonova AG, Stafa (CH)

(72) Inventors: Henry Luo, Waterloo (CA); Shawn Lee, Kitchener (CA); Ara Talaslian, Cambridge (CA); Greg Nawrocki, Kitchener (CA)

(73) Assignee: SONOVA AG, Stäfa (CH)

( * ) Notice: Subject to any disclaimer, the term of this patent is extended or adjusted under 35 U.S.C. 154(b) by 150 days.

(21) Appl. No.: 16/477,587

(22) PCT Filed: Jan. 12, 2017

(86) PCT No.: PCT/EP2017/050595
§ 371 (c)(1),
(2) Date: Jul. 12, 2019

(87) PCT Pub. No.: WO2018/130287
PCT Pub. Date: Jul. 19, 2018

(65) Prior Publication Data
US 2019/0373359 A1 Dec. 5, 2019

(51) Int. Cl.
*H04R 1/10* (2006.01)
*H03G 3/32* (2006.01)
(Continued)

(52) U.S. Cl.
CPC .............. *H04R 1/1091* (2013.01); *H03G 3/32* (2013.01); *H03G 9/025* (2013.01);
(Continued)

(58) Field of Classification Search
CPC combination set(s) only.
See application file for complete search history.

(56) References Cited

U.S. PATENT DOCUMENTS 5,862,223 A * 1/1999 Walker ........... G06Q 10/063112
705/50
5,862,238 A * 1/1999 Agnew ................ H04R 25/356
381/321
(Continued)

FOREIGN PATENT DOCUMENTS

EP 0 844 804 A1 5/1998
EP 1 471 767 A2 10/2004
(Continued)

OTHER PUBLICATIONS

International Search Report for PCT/EP2017/050595 dated Oct. 10, 2017.
Written Opinion for PCT/EP2017/050595 dated Oct. 10, 2017.

*Primary Examiner* — Duc Nguyen
*Assistant Examiner* — Assad Mohammed
(74) *Attorney, Agent, or Firm* — Pearne & Gordon LLP

(57) ABSTRACT

A hearing device for being worn at or at least partly within an ear of a user and including an acoustic shock detector for detecting an acoustic shock event present in an input audio signal from an input transducer and providing shock detection information related to the acoustic shock event. The hearing device further includes an acoustic shock controller for determining a first gain factor ($G_b$) and a second gain factor ($G_p$) in dependence of the shock detection information, a first attenuator for attenuating a processed input audio signal by the first gain factor ($G_b$) and providing an attenuated audio signal to an output limiter providing a limited audio signal, and a second attenuator for attenuating the limited audio signal by the second gain factor ($G_p$) and providing a further attenuated audio signal to an output transducer. A corresponding method for acoustic shock control in a hearing device.

19 Claims, 3 Drawing Sheets

(51) Int. Cl.
*H03G 9/02* (2006.01)
*H04R 25/00* (2006.01)

(52) U.S. Cl.
CPC ......... *H04R 25/356* (2013.01); *H04R 25/505* (2013.01); *H04R 25/552* (2013.01); *H04R 2430/01* (2013.01); *H04R 2430/03* (2013.01); *H04S 2400/13* (2013.01)

(56) References Cited

U.S. PATENT DOCUMENTS

| | | | |
|---|---|---|---|
| 7,983,425 B2 | 7/2011 | Luo | |
| 2002/0102001 A1* | 8/2002 | Ohama | H03G 5/08 381/99 |
| 2004/0234079 A1* | 11/2004 | Schneider | H04R 25/453 381/58 |
| 2006/0074642 A1* | 4/2006 | You | G10L 19/025 704/222 |
| 2006/0147049 A1 | 7/2006 | Bayley et al. | |
| 2009/0274322 A1* | 11/2009 | Chang | H03G 9/005 381/107 |
| 2010/0254540 A1* | 10/2010 | Bang | H04R 25/70 381/60 |
| 2011/0106209 A1* | 5/2011 | Saoji | A61N 1/37247 607/57 |
| 2013/0195278 A1* | 8/2013 | Swanson | H03G 1/00 381/57 |
| 2014/0044158 A1* | 2/2014 | Raghu | H04B 1/0039 375/224 |
| 2014/0177868 A1* | 6/2014 | Jensen | G10L 21/0208 381/94.7 |
| 2014/0364681 A1* | 12/2014 | Hillbratt | H04R 25/453 600/25 |
| 2015/0044980 A1* | 2/2015 | Eddowes | H04B 17/21 455/226.2 |
| 2015/0248889 A1* | 9/2015 | Dickins | G10L 19/012 704/500 |
| 2017/0064461 A1* | 3/2017 | Thomsen | H04W 52/0277 |

FOREIGN PATENT DOCUMENTS

| | | |
|---|---|---|
| EP | 2 512 157 B1 | 10/2012 |
| EP | 2 963 817 B1 | 1/2016 |
| WO | 93/00779 A1 | 1/1993 |

* cited by examiner

HEARING DEVICE WITH ACOUSTIC SHOCK CONTROL AND METHOD FOR ACOUSTIC SHOCK CONTROL IN A HEARING DEVICE

TECHNICAL FIELD

The present invention pertains to hearing devices. Specifically, a hearing device with acoustic shock control as well as a method for acoustic shock control in a hearing device are proposed.

BACKGROUND OF THE INVENTION

In the context of the present invention the term "hearing device" refers to hearing aids (alternatively called hearing instruments or hearing prostheses) used to compensate hearing impairments of hard of hearing persons, as well as to audio and communication devices used to provide sound signals to persons with normal hearing capability, e.g. in order to improve hearing in harsh acoustic surroundings, and also to hearing protection devices employed to prevent damaging of the sense of hearing of a person when exposed to very loud noises such as gunshots. Such hearing devices are typically worn at or at least party within the ear, e.g. within the ear canal of the user.

Acoustic shocks are a common problem when employing such hearing devices, which usually amplify the ambient sound in order to improve the user's perception of the prevailing acoustic situation. An acoustic shock is defined as a sudden increase of sound level (i.e. the amplitude/volume of the sound signal) to which a person is exposed, which may cause discomfort if not handled properly by a hearing device. Typically, sudden sound level increases can result from loud noises such as for instance breaking dishes, hammering, a door slam, a gunshot, a firecracker, or any other kinds of impulse or transient noise.

Many different approaches have been developed to address the detrimental effects of such acoustic shocks. General input-output compression strategies such as wide dynamic range compression (WDRC) are effective, but react too slowly versus the very fast nature of acoustic shock impulses. Maximum power output (MPO) in the frequency-domain can be applied to prevent overshooting, but it is also too slow to be effective. Peak-clipping in the time-domain such as time-domain MPO is effective and fast, but usually causes serious distortion leading to poor sound quality. Often high-pass filters are used for shock detection, because the transient noise has most of its energy at high frequencies. Low-pass filters are often used to attenuate the transient noise without simultaneously affecting the speech content of the impinging sound.

A method and system for acoustic shock detection is provided in U.S. Pat. No. 7,983,425 B2, where it is suggested to detect an acoustic shock in the time-domain based on the peak level, the attack time and the duration of the prevailing input signal. Based on these parameters a shock contrast level is determined as the difference between the peak level and the signal floor, which is used as an indicator for an acoustic shock event. The proposed method provides a quick and reliable shock detector that operates in the time-domain. Shock detection takes place with zero time delay, or even predicts the shock before it fully passes through the signal processing performed in the frequency-domain by the hearing device. Based on this reliable and quick shock detection, an effective anti-shock management/control is carried out to adaptively reduce the acoustic shock. As a result the wearer of the hearing device is not subjected to any annoying or uncomfortable acoustic shock while keeping natural acoustic environment awareness and normal input signal quality.

A subband-based acoustic shock algorithm is presented in EP 1 471 767 A2. The described scheme works well for some kinds of slow shocks since it samples input signal energy with a block of R samples of about 0.5 ms. However, many fast shocks can be much shorter than 0.5 ms, and they may not be detected with this method. The additional time delay required by the system causes new problems for hearing devices since an overall signal delay beyond 10 ms can be perceived as noticeable acoustic latency, which is not desired.

US 2006/0147049 A1 presents a sound pressure level limiter with anti-startle feature for audio systems. This anti-startle feature may be implemented with a delta incident detector for detecting delta acoustic incidents that exceed a predetermined acoustic startle boundary, a delta limiter for determining an anti-startle gain, and an amplifier to apply the anti-startle gain to the input signal. The delta incident detector may detect delta incidents based on an estimated true sound pressure level (SPL) delivered by a transducer to a predetermined datum point. The estimated true SPL may be determined based on a measured receiving frequency response of the transducer. An SPL limiter may also determine an SPL gain in response to detecting an SPL acoustic incident that exceeds a predetermined SPL threshold, and an amplifier may apply the SPL gain to the input signal to reduce it below the threshold.

In digital systems and devices these solutions are implemented in the form of shock reduction algorithms. Many of these are based on peak-clipping in order to minimise delay, but which, as previously mentioned, usually introduce artefacts or distortion into the signal. Some more advanced peak-clipping technologies use an adaptive clipping threshold to handle different levels of shock. However, the same problems of distortion or uncomfortable artificial effects still cannot be avoided with adaptive peak clipping. Some other more sophisticated shock reduction algorithms detect transient noises in both the time-domain and individual frequency bands, then apply shock reduction in specific frequency bands while keeping the normal signal in other frequency bands untouched, as presented in EP 1 471 767 A2 referred to above. Although many of these algorithms are quite successful for telecommunication applications, typically experienced by a user through headphones or a headset, they usually add more delay and require intensive computational power. Since miniature ear-worn hearing devices possess limited computational power and cannot afford an excessive delay of the acoustic signal, this restricts the application of such techniques.

Acoustic shock should never be eliminated completely in hearing devices, even if it is technically possible to do so. An acoustic shock is a type of acoustic event, typically an alarming event, which belongs to the acoustic environment. It is critical that such acoustic events are not taken away or hidden from the user for his safety. In extreme situations such as a gunshot or car crash, common sense dictates that the user should be able to sense the event so that he or she can react accordingly, but this is also true in more moderate cases of acoustic shock such as dishes breaking or a door slamming. What is needed is that the acoustic shock event is provided to the user within a reasonable loudness range without causing hearing damage or discomfort.

Hence, there exists a need for improved means for acoustic shock control, capable of detecting and controlling the level of perceived acoustic shocks adaptively for different environments in an optimised way in order to maintain the natural sound quality of acoustic shock events. In particular, the acoustic shock control should not eliminate shock events and prevent a hearing device user from hearing them altogether, but help promote environmental awareness by keeping the shock sound natural whilst avoiding any harm to the user's sense of hearing.

SUMMARY OF THE INVENTION

The object of the present invention is to provide a hearing device with improved acoustic shock control. This object is achieved by the hearing device according to claim 1.

It is a further object of the present invention to provide an improved method for acoustic shock control in a hearing device. Such a method is defined in claim 15.

Specific embodiments of the present invention are provided in the dependent claims.

In a first aspect, the present invention is directed to a hearing device structured to be worn at or at least partly within an ear of a user of the hearing device comprising:
 an input transducer structured and configured to receive an audio signal and to convert the received audio signal into an input audio signal;
 an audio signal processor structured and configured to process the input audio signal and to provide a processed audio signal;
 an output limiter structured and configured to limit a signal level of a signal applied to an input of the output limiter to a maximum signal level and to provide a limited audio signal;
 an output transducer structured and configured to convert a signal applied to an input of the output transducer into an output audio signal to be provided to the user; and
 an acoustic shock detector structured and configured to detect an acoustic shock event present in the input audio signal and to provide shock detection information related to the acoustic shock event,
characterised in that the hearing device further comprises:
 an acoustic shock controller structured and configured to determine a first gain factor and a second gain factor in dependence of the shock detection information;
 a first attenuator structured and configured to attenuate the processed audio signal by the first gain factor and to provide an attenuated audio signal to the input of the output limiter; and
 a second attenuator structured and configured to attenuate the limited audio signal by the second gain factor and to provide a further attenuated audio signal to the input of the output transducer.

In this way the acoustic shock controller does not impair environmental awareness by ensuring that shock events remain perceivable to a user of the hearing device even in those cases where the output signal of traditional hearing devices is heavily saturated and the sound output by the receiver is therefore severely limited, thus essentially eliminating the shock event.

In an embodiment of the hearing device the acoustic shock controller is adapted to determine a total gain factor as well as a first gain distribution coefficient and a second gain distribution coefficient, all in dependence of the shock detection information, and wherein the total gain factor is the product of the first and second gain factors, and the sum of the first gain distribution coefficient and the second gain distribution coefficient is a constant (e.g. equal to one), and wherein the first gain factor is determined as the total gain factor multiplied by the first gain distribution coefficient and the second gain factor is determined as the total gain factor multiplied by the second gain distribution coefficient.

In a further embodiment of the hearing device the acoustic shock controller is adapted to adjust the first gain factor and the second gain factor in dependence of a degree of saturation of the limited audio signal, and wherein the acoustic shock controller is in particular adapted to increase the first gain factor and to decrease the second gain factor when the degree of saturation decreases.

In a further embodiment of the hearing device the acoustic shock controller is adapted to adjust the first gain factor and the second gain factor in dependence of the (pre-set) maximum signal level of the output limiter.

In a further embodiment the hearing device further comprises an audio analyser, in particular being or comprising a sound classifier, for determining a type of a momentary acoustic environment based on the input audio signal, and wherein the acoustic shock controller is adapted to adjust the first gain factor and the second gain factor in dependence of the type of the momentary acoustic environment, as well as in particular to adjust the total gain factor as well as the first gain distribution coefficient and the second gain distribution coefficient in dependence of the type of the momentary acoustic environment.

In a further embodiment of the hearing device the acoustic shock detector is adapted to detect a type of the acoustic shock event and to provide the type of the acoustic shock event as part of the shock detection information, and wherein the acoustic shock controller is adapted to adjust the first gain factor and the second gain factor in dependence of the type of the acoustic shock event, as well as in particular to adjust the total gain factor as well as the first gain distribution coefficient and the second gain distribution coefficient in dependence of the type of the acoustic shock event.

In a further embodiment the hearing device further comprises:
 an analysis filter bank structured and configured to decompose the input audio signal into a plurality of band-limited input audio signals each associated with a corresponding frequency band; and
 a synthesis filter bank structured and configured to combine or compose a plurality of band-limited input signals of the synthesis filter bank into a single signal provided to the input of the output transducer, wherein the audio signal processor processes each of the band-limited input audio signals to provide a plurality of processed band-limited audio signals, and wherein the acoustic shock controller is adapted to determine a first frequency-dependent gain factor and a second frequency-dependent gain factor for each frequency band in dependence of the shock detection information, and wherein the first attenuator is adapted to attenuate each of the processed band-limited audio signals by the corresponding first frequency-dependent gain factor and to provide a plurality of attenuated band-limited audio signals, and wherein the output limiter is adapted to limit the signal level of each of the plurality of attenuated audio signals to a maximum signal level, wherein in particular the maximum signal level is individual for each frequency band, and to provide a plurality of band-limited limited audio signals, and wherein the second attenuator is adapted to attenuate each of the band-limited limited audio signals by the corresponding second frequency-dependent gain factor and to provide a plurality of further attenuated audio signals as input signals to the synthesis filter bank.

In a further embodiment of the hearing device the acoustic shock controller is adapted to determine a total frequency-dependent gain factor as well as a first frequency-dependent gain distribution coefficient and a second frequency-dependent gain distribution coefficient for each frequency band, all in dependence of the shock detection information, and wherein the total frequency-dependent gain factor is the product of the first and second frequency-dependent gain factors for each frequency band, and the sum of the first frequency-dependent gain distribution coefficient and the second frequency-dependent gain distribution coefficient is a constant (e.g. equal to one) for each frequency band, and wherein the first frequency-dependent gain factor is determined as the total frequency-dependent gain factor multiplied by the first frequency-dependent gain distribution coefficient and the second frequency-dependent gain factor is determined as the total frequency-dependent gain factor multiplied by the second frequency-dependent gain distribution coefficient for each frequency band.

In a further embodiment of the hearing device the acoustic shock controller is adapted to adjust the first frequency-dependent gain factor and the second frequency-dependent gain factor in dependence of a frequency-dependent degree of saturation of the band-limited limited audio signal for each frequency band, and wherein the acoustic shock controller is in particular adapted to increase the first frequency-dependent gain factor and to decrease the second frequency-dependent gain factor when the frequency-dependent degree of saturation decreases.

In a further embodiment of the hearing device the acoustic shock controller is adapted to adjust the first frequency-dependent gain factor and the second frequency-dependent gain factor for each frequency band in dependence of the type of the momentary acoustic environment.

In a further embodiment of the hearing device the acoustic shock controller is adapted to adjust the first frequency-dependent gain factor and the second frequency-dependent gain factor for each frequency band in dependence of the type of the acoustic shock event.

In a further embodiment of the hearing device the acoustic shock controller is adapted to adjust the first gain factor and the second gain factor, or alternatively the first frequency-dependent gain factor and the second frequency-dependent gain factor for each frequency band, or the total gain, or alternatively the total frequency-dependent gain for each frequency band, in dependence of personal preferences of the user.

In a further embodiment the hearing device further comprises a control element structured and configured to receive user inputs, and wherein the acoustic shock controller is adapted to adjust the personal preferences in dependence of the user inputs, and wherein in particular the hearing device is adapted to receive initial personal preferences from a fitting device.

In a further embodiment the hearing device further comprises a transceiver adapted to transmit information to and to receive information from a second hearing device and intended to be worn at or at least partly within another ear of the user, wherein said information comprises at least one of the following:
the shock detection information;
the first gain factor and/or the second gain factor;
the first frequency-dependent gain factor and/or the second frequency-dependent gain factor for one or more of the frequency bands;
the total gain factor and/or the first gain distribution coefficient and/or the second gain distribution coefficient;
the total frequency-dependent gain factor and/or the first frequency-dependent gain distribution coefficient and/or the second frequency-dependent gain distribution coefficient for one or more of the frequency bands;
the type of the momentary acoustic environment;
the type of the acoustic shock event,
wherein the acoustic shock controller is adapted to apply the information received from the other hearing device to determine at least one of the following in the hearing device:
the shock detection information;
the first gain factor and/or the second gain factor;
the first frequency-dependent gain factor and/or the second frequency-dependent gain factor for one or more of the frequency bands;
the total gain factor and/or the first gain distribution coefficient and/or the second gain distribution coefficient;
the total frequency-dependent gain factor and/or the first frequency-dependent gain distribution coefficient and/or the second frequency-dependent gain distribution coefficient for one or more of the frequency bands;
the type of the momentary acoustic environment;
the type of the acoustic shock event.

In a second aspect, the present invention is directed to a method for acoustic shock control in a hearing device intended to be worn at or at least partly within an ear of a user of the hearing device, comprising the steps of:
a) receiving an audio signal and based thereupon providing an input audio signal;
b) detecting an acoustic shock event present in the input audio signal and providing shock detection information related to the acoustic shock event;
c) processing the input audio signal and providing a processed audio signal;
d) determining a first gain factor and a second gain factor in dependence of the shock detection information;
e) attenuating the processed audio signal by the first gain factor and providing an attenuated audio signal;
f) limiting a signal level of the attenuated audio signal to a maximum signal level and providing a limited audio signal;
g) attenuating the limited audio signal by the second gain factor and providing a further attenuated audio signal as an output audio signal; and
h) outputting the output audio signal to the user.

In an embodiment the method further comprises the steps of:
decomposing the input audio signal into a plurality of band-limited input audio signals each associated with a corresponding frequency band; and
combining or composing a plurality of band-limited output audio signals into a single output audio signal,
wherein steps c) to g) are performed individually for each frequency band.

In a further embodiment the method further comprises the steps of:
transmitting information to a second hearing device intended to be worn at or at least partly within another ear of the user;
receiving information from the second hearing device, wherein said information comprises at least one of the following:
the shock detection information;
the first gain factor and/or the second gain factor;

the first frequency-dependent gain factor and/or the second frequency-dependent gain factor for one or more of the frequency bands;
the total gain factor and/or the first gain distribution coefficient and/or the second gain distribution coefficient;
the total frequency-dependent gain factor and/or the first frequency-dependent gain distribution coefficient and/or the second frequency-dependent gain distribution coefficient for one or more of the frequency bands;
the type of the momentary acoustic environment;
the type of the acoustic shock event,
and wherein the information received from the other hearing device is employed for determining at least one of the following in the hearing device:
the shock detection information;
the first gain factor and/or the second gain factor;
the first frequency-dependent gain factor and/or the second frequency-dependent gain factor for one or more of the frequency bands;
the total gain factor and/or the first gain distribution coefficient and/or the second gain distribution coefficient;
the total frequency-dependent gain factor and/or the first frequency-dependent gain distribution coefficient and/or the second frequency-dependent gain distribution coefficient for one or more of the frequency bands;
the type of the momentary acoustic environment;
the type of the acoustic shock event.
It is pointed out that combinations of the above-mentioned embodiments may give rise to even further, more specific embodiments according to the present invention.

BRIEF DESCRIPTION OF THE DRAWINGS

The present invention is further explained below by means of non-limiting specific embodiments/examples and with reference to the accompanying drawings, which show.

DETAILED DESCRIPTION OF THE INVENTION

Figure 1:
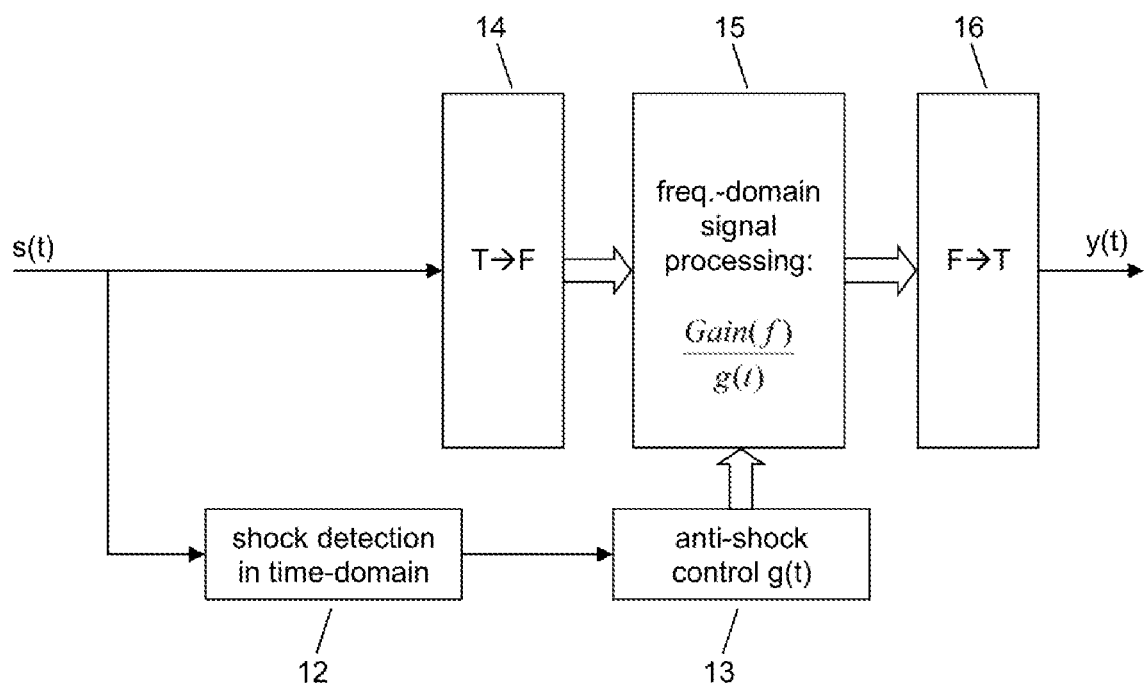
FIG. 1 a high-level block diagram of a prior art scheme where fast shock detection is performed in the time-domain and anti-shock control is applied in the frequency-domain.

FIG. 1 illustrates in a high-level block diagram a prior art anti-shock system as provided in U.S. Pat. No. 7,983,425 B2 (cf. FIG. 6 therein). The sound is picked up by a microphone providing an input signal s(t) and then transformed from the time-domain to the frequency-domain, e.g. by an analysis filter bank 14 or a fast Fourier transform (FFT). A fast shock detector 12 operating in the time-domain can detect the presence of an acoustic shock event in the input signal s(t), and determine how strong the shock is, what kind of shock it is and can adapt to the changes in the acoustic environment by detecting the relative shock and the absolute shock. The anti-shock control 13 will immediately react to the detected shock without delay and apply an appropriate gain/attenuation as part of the frequency-domain processing 15. Subsequently, the frequency-domain signal is transformed back to the time-domain, e.g. by a synthesis filter bank 16 (e.g. a summer/combiner) or an inverse FFT (IFFT), and the resulting signal y(t) is output for instance by means of a receiver.

Figure 2:
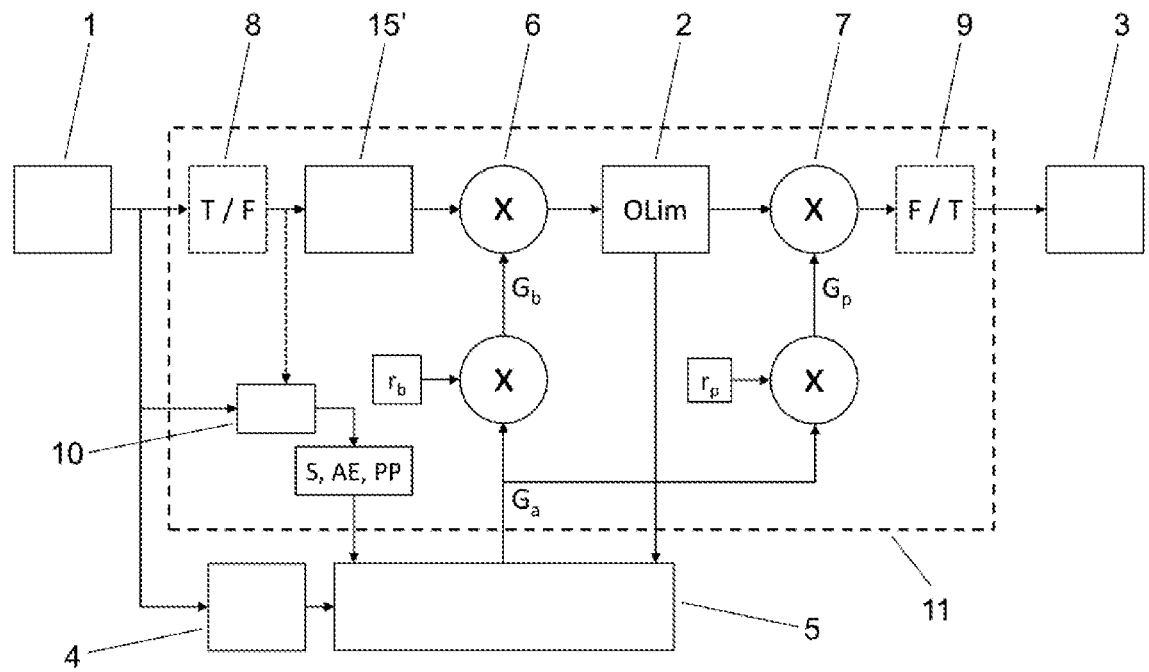
FIG. 2 a block diagram of a hearing device with acoustic shock control exemplifying a variety of possible embodiments according to the present invention.

FIG. 2 depicts a block diagram of a hearing device with acoustic shock control exemplifying a variety of possible embodiments according to the present invention. An audio signal (sound) is picked up by the input transducer 1, e.g. a microphone, and provided as an input signal to a processor 11, such as a digital signal processor (DSP), to be processed according to the needs and preferences of a user of the hearing device. The processed signal is subsequently output by an output transducer 3, such as a miniature loudspeaker (also commonly referred to as receiver), a cochlear implant or a direct acoustic cochlear stimulator (DACS). In an embodiment the input signal is transformed from the time-domain to the frequency-domain, e.g. by an analysis filter bank 8 or an FFT. Subsequently, the transformed signal is processed in the frequency-domain in block 15', such as applying a frequency-dependent gain in order to compensate the user's hearing loss/impairment. Typically (i.e. in the prior art), the processed signal is then applied to an output limiter 2 to limit the signal to a maximum signal level before being transformed back to the time-domain, e.g. by a synthesis filter bank 9 or an IFFT. However, according to the present invention the processed signal is additionally attenuated by a first attenuator 6 by a first gain/attenuation factor $G_b$ prior to the output limiter 2 and further attenuated by a second attenuator 7 by a second gain/attenuation factor $G_p$ after the output limiter 2. In this way it is possible to ensure that shock events remain perceivable even in situations where the input signal would traditionally be severely clipped and the output signal provided to the output transducer 3 is entirely saturated. The first and second gain/attenuation factors $G_b$, $G_p$ are determined by an acoustic shock controller 5 dependent on shock detection information provided by an acoustic shock detector 4. Such shock detection information may for instance be information regarding a signal floor, a peak signal level, a shock contrast level (e.g. a difference between the peak signal level and the signal floor), an attack time, a shock index (e.g. based on the shock contrast level and the attack time), the duration of the shock or the type of shock. In an embodiment according to FIG. 2 the acoustic shock detector 4 is implemented in the time-domain in order to achieve very fast detection and the processing is performed in the frequency-domain. Because transforming the input signal from the time-domain into the frequency-domain incurs a delay the first and second gain/attenuation factors $G_b$, $G_p$ can be determined by the acoustic shock controller 5 in time to be applied to the delayed processed signal containing the shock in the frequency-domain. However, it is also conceivable that the processing of the input signal as well as the shock detection are both performed in the time-domain or that the processing of the input signal as well as the shock detection are both performed in the frequency-domain.

Alternatively to directly determining the two gain/attenuation factors $G_b$, $G_p$, the acoustic shock controller 5 may calculate a total gain/attenuation factor $G_a$ along with a first gain distribution coefficient $r_b$ and a second gain distribution coefficient $r_p$, whereby the sum of the two equals one ($r_b+r_p=1$), and the first gain/attenuation factor is equal to the product of the total gain/attenuation factor $G_a$ and the first gain distribution coefficient $r_b$ ($G_b=G_a \times r_b$) and the second gain/attenuation factor is equal to the product of the total gain/attenuation factor $G_a$ and the second gain distribution coefficient $r_p$ ($G_p=G_a \times r_p$), as indicated by the multipliers in FIG. 2.

The acoustic shock controller 5 may for instance adjust the first gain/attenuation factor $G_b$ and the second gain/attenuation factor $G_p$ in dependence of a degree of saturation S of the limited audio signal. In particular, the acoustic shock controller 5 may increase the first gain factor $G_b$ and decrease the second gain factor $G_p$ when the degree of saturation S decreases, and vice-versa. The acoustic shock controller 5 may correspondingly adjust the first and second gain distribution coefficients $r_b$, $r_p$ in dependence of the degree of saturation S. The degree of saturation S is for instance given by the relative amount of time where the signal level of the signal applied to the input of the output limiter 2 exceeds the maximum signal level of the output limiter 2, i.e. where the input signal is clipped. Alternatively, the degree of saturation S is for instance given by the ratio of the maximum value of the signal applied to the input of the output limiter 2 and the mean value of the signal applied to the input of the output limiter 2.

Furthermore, the acoustic shock controller 5 may for instance adjust the first gain/attenuation factor $G_b$ and the second gain/attenuation factor $G_p$ (and correspondingly the first and second gain distribution coefficients $r_b$, $r_p$) in dependence of the maximum signal level of the output limiter 2, which can be pre-set for instance by a fitter of the hearing device.

Moreover, the acoustic shock controller 5 may adjust the first gain/attenuation factor $G_b$ and the second gain/attenuation factor $G_p$ (or the total gain factor $G_a$ and correspondingly the first and second gain distribution coefficients $r_b$, $r_p$) in dependence of the type of the momentary acoustic environment AE, which is determined by an audio analyser 10 (being or comprising a sound classifier).

Additionally, the acoustic shock controller 5 may adjust the first gain/attenuation factor $G_b$ and the second gain/attenuation factor $G_p$ (or the total gain factor $G_a$ and correspondingly the first and second gain distribution coefficients $r_b$, $r_p$) in dependence of personal preferences PP of the user, which are determined during fitting of the hearing device to the individual user.

Figure 3:
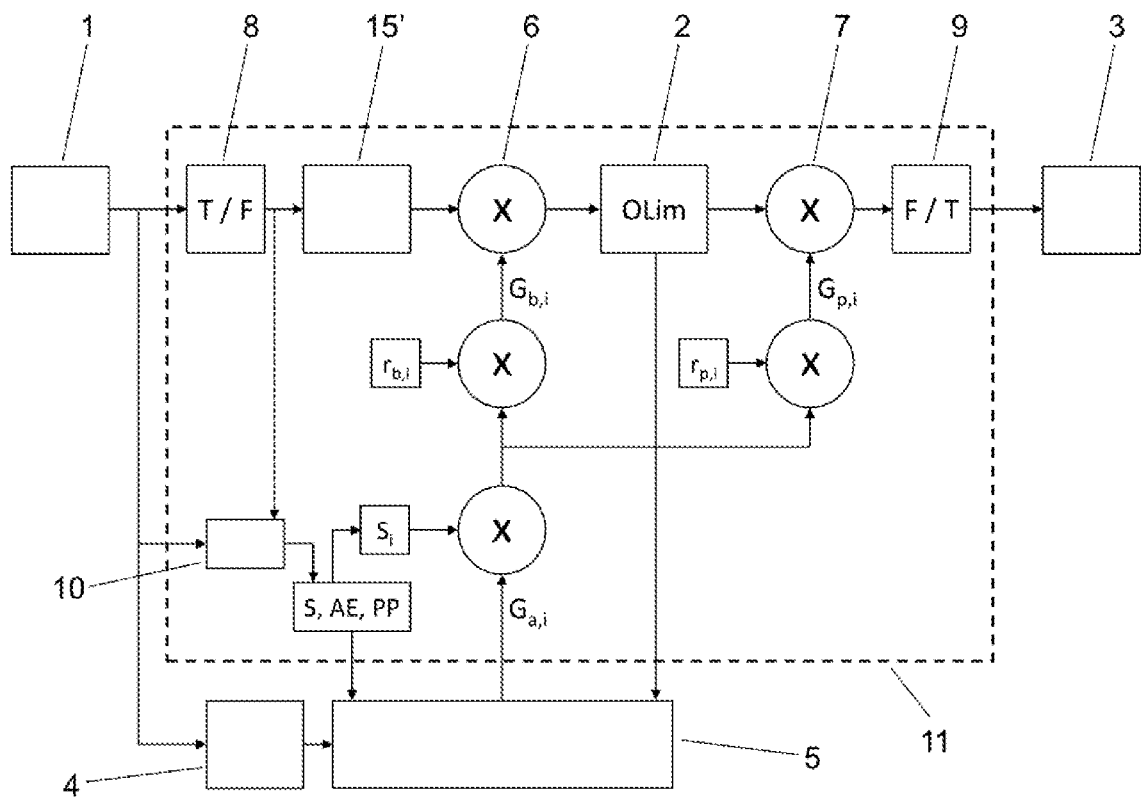
FIG. 3 a further block diagram of a hearing device with acoustic shock control exemplifying a variety of possible further embodiments according to the present invention.

FIG. 3 depicts a further block diagram of a hearing device with acoustic shock control exemplifying a variety of possible further embodiments according to the present invention. The difference between the embodiments shown in FIGS. 2 & 3 is that in FIG. 3 the applied gains/attenuations $G_{b,i}$, $G_{p,i}$ are individual/specific for different frequency bands Fi (likewise for $G_{a,i}$, $r_{b,i}$ & $r_{p,i}$). Furthermore, the acoustic shock controller 5 may adjust these gains/attenuations $G_{b,i}$, $G_{p,i}$ in dependence of a frequency-dependent degree of saturation $S_i$, which in turn may be dependent the personal preferences PP of the user based on his individual hearing loss/impairment such as given by the user's audiogram.

Figure 4:
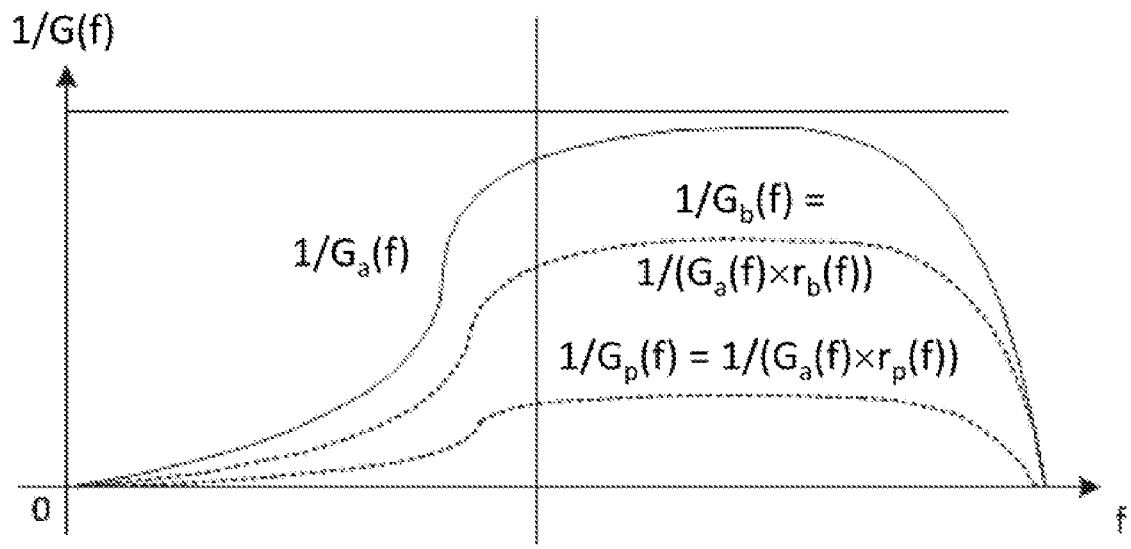
FIG. 4 a graph illustrating an exemplary frequency shaping according to the present invention resulting from applying a frequency-dependent gain G(f) (plotted as an attenuation function 1/G(f))

An exemplary frequency shaping of the gain/attenuation provided by the embodiments shown in FIG. 3 are illustrated in FIG. 4, which depicts a graph of the frequency-dependent attenuation functions $1/G_a$, $1/G_b$ & $1/G_p$, where a high attenuation is applied to high audio frequencies and a low attenuation is applied to low audio frequencies. In this graph the attenuation is greater than one ($1/G(f)>1$), i.e. the gain is less than one ($G(f)<1$). On a logarithmic (decibel) scale attenuations are negative and gains are positive.

Figure 5:
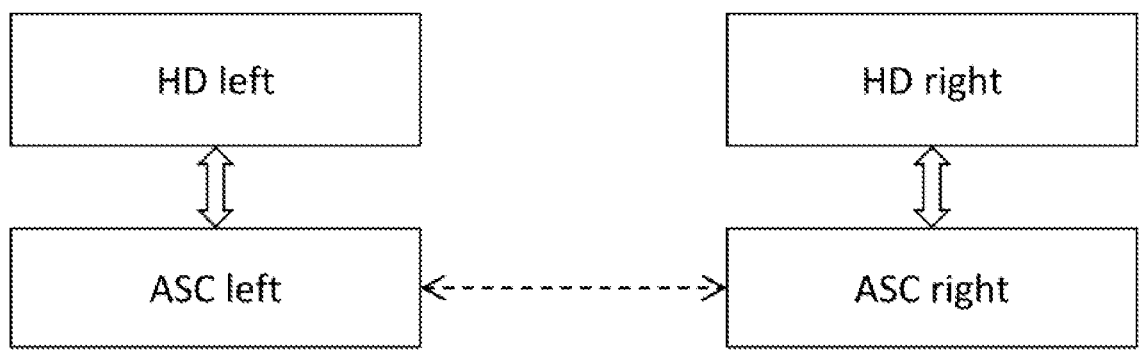
FIG. 5 a schematic high-level block diagram of a binaural hearing system comprising a left and a right hearing device with coordinated acoustic shock control according to the present invention.
In the figures, like reference signs refer to like parts.

FIG. 5 schematically depicts a high-level block diagram of a binaural hearing system comprising a left and a right hearing device. Each hearing device comprises it own acoustic shock controller ASC, however these two acoustic shock controllers are linked to one another, e.g. wirelessly, to allow coordination between them. This is advantageous in order to ensure that shock events can be localised correctly by a user of the binaural hearing system. To achieve this for instance shock detection information, the gain factors $G_b$ and $G_p$, etc. may be exchanged between the two hearing devices, so that the left hearing device is aware of how an acoustic shock event is detected/registered by the right hearing device (and vice-versa) and how the hearing devices would independently react to the shock event, allowing the reaction to be modified, in particular aligned, to ensure correct localisation of the shock source.

The proposed shock control scheme according to the present invention based on distributing an overall/total shock control gain $G_a$ before ($G_b$) and after ($G_p$) the output limiter 2 provides an adaptive and intelligent anti-shock mechanism keeping the acoustic shock event perceivable in a natural and comfortable manner for all users and in all hearing situations, without unduly impacting desired target signals such as speech or music. Moreover, the proposed binaurally coordinated anti-shock scheme according to the present invention preserves localisation information such that the acoustic shock events are also perceived in a natural and comfortable way. Hence, the acoustic shock control according to the present invention achieves the following objectives:
- reduces (or minimises) the shock impact;
- keeps the sound natural to allow awareness by the user of the type of shock event;
- retains the relative loudness of a shock so that the user can perceive the shock level; and
- maintains the shock within the comfort range of the user.

As can be seen in the extreme case where the anti-shock gain control is completely applied after the output limiter (i.e. $G_b=1$, $G_p=G_a$), the user is still able to perceive the shock even when the signal at the output of the limiter is fully saturated. Therefore, shock awareness is maintained in all situations.

The acoustic shock control proposed by the present invention therefore provides the following benefits:
- Even for hearing devices applying a very high amplification due to a severe hearing loss of the user, thus driving the hearing device to be nearly or fully saturated, the proposed anti-shock gain control scheme ensures that acoustic shock events remain perceivable to all users and in all hearing situations.
- By restricting attenuation of the output signal to those frequency bands in which the shock signal is present the desired target signal, e.g. speech or music, is not detrimentally effected.
- The proposed adaptive anti-shock scheme is adapted to prevailing acoustic environment and thus delivers the best performance for different hearing situations.
- The proposed anti-shock scheme is personalised dependent on the individual user's needs or preferences and therefore provides the best benefit for different individuals.
- In binaural hearing systems the proposed coordinated anti-shock scheme takes into account that shock signals may have different intensity levels and temporal characteristics at the two hearing devices depending on where the source of the shock event is located. Therefore, information is exchanged between the acoustic shock controllers of the two hearing devices, in order to avoid the situation where a shock is only detected by one of the hearing devices, which then attenuates the shock signal, whilst the other hearing device does not react to the shock, hence making it difficult for the user to localise where the shock signal is coming from.

What is claimed is:

1. A hearing device structured to be worn at or at least partly within an ear of a user of the hearing device comprising:
   an input transducer (1) structured and configured to receive an audio signal and to convert the received audio signal into an input audio signal;
   an audio signal processor (15') structured and configured to process the input audio signal and to provide a processed audio signal;
   an output limiter (2) structured and configured to limit a signal level of a signal applied to an input of the output limiter to a maximum signal level and to provide a limited audio signal;
   an output transducer (3) structured and configured to convert a signal applied to an input of the output transducer (3) into an output audio signal to be provided to the user; and
   an acoustic shock detector (4) structured and configured to detect an acoustic shock event present in the input audio signal and to provide shock detection information related to the acoustic shock event,
   characterised in that the hearing device further comprises:
   an acoustic shock controller (5) structured and configured to determine a first gain factor ($G_b$) and a second gain factor ($G_p$) in dependence of the shock detection information;
   a first attenuator (6) structured and configured to attenuate the processed audio signal by the first gain factor ($G_b$) and to provide an attenuated audio signal to the input of the output limiter (2); and
   a second attenuator (7) structured and configured to attenuate the limited audio signal by the second gain factor ($G_p$) and to provide a further attenuated audio signal to the input of the output transducer (3).

2. The hearing device of claim 1, wherein the acoustic shock controller (5) is adapted to determine a total gain factor ($G_a$) as well as a first gain distribution coefficient ($r_b$) and a second gain distribution coefficient ($r_p$), all in dependence of the shock detection information, and wherein the total gain factor ($G_a$) is the product of the first and second gain factors ($G_a$, $G_p$), and the sum of the first gain distribution coefficient ($r_b$) and the second gain distribution coefficient ($r_p$) is a constant, and wherein the first gain factor ($G_b$) is determined as the total gain factor ($G_a$) multiplied by the first gain distribution coefficient ($r_b$) and the second gain factor ($G_p$) is determined as the total gain factor ($G_a$) multiplied by the second gain distribution coefficient ($r_p$).

3. The hearing device of claim 1, wherein the acoustic shock controller (5) is adapted to adjust the first gain factor ($G_b$) and the second gain factor ($G_p$) in dependence of a degree of saturation (S) of the limited audio signal, and wherein the acoustic shock controller (5) is in particular adapted to increase the first gain factor ($G_b$) and to decrease the second gain factor ($G_p$) when the degree of saturation (S) decreases.

4. The hearing device of claim 1, wherein the acoustic shock controller (5) is adapted to adjust the first gain factor ($G_b$) and the second gain factor ($G_p$) in dependence of the maximum signal level of the output limiter (2).

5. The hearing device of claim 1, wherein the hearing device further comprises an audio analyser (10), in particular being or comprising a sound classifier, for determining a type of a momentary acoustic environment (AE) based on the input audio signal, and wherein the acoustic shock controller (5) is adapted to adjust the first gain factor ($G_b$) and the second gain factor ($G_p$) in dependence of the type of the momentary acoustic environment (AE), as well as in particular to adjust the total gain factor ($G_a$) as well as the first gain distribution coefficient ($r_b$) and the second gain distribution coefficient ($G_p$) in dependence of the type of the momentary acoustic environment (AE).

6. The hearing device of claim 1, wherein the acoustic shock detector (5) is adapted to detect a type of the acoustic shock event and to provide the type of the acoustic shock event as part of the shock detection information, and wherein the acoustic shock controller (5) is adapted to adjust the first gain factor ($G_b$) and the second gain factor ($G_p$) in dependence of the type of the acoustic shock event, as well as in particular to adjust the total gain factor ($G_a$) as well as the first gain distribution coefficient ($r_b$) and the second gain distribution coefficient ($r_p$) in dependence of the type of the acoustic shock event.

7. The hearing device of claim 1, wherein the hearing device further comprises:
   an analysis filter bank (8) structured and configured to decompose the input audio signal into a plurality of band-limited input audio signals each associated with a corresponding frequency band; and
   a synthesis filter bank (9) structured and configured to combine or compose a plurality of band-limited input signals of the synthesis filter bank (9) into a single signal provided to the input of the output transducer (3),
   wherein the audio signal processor (15') processes each of the band-limited input audio signals to provide a plurality of processed band-limited audio signals, and
   wherein the acoustic shock controller (5) is adapted to determine a first frequency-dependent gain factor ($G_{b,i}$) and a second frequency-dependent gain factor ($G_{b,i}$) for each frequency band in dependence of the shock detection information, and
   wherein the first attenuator (6) is adapted to attenuate each of the processed band-limited audio signals by the corresponding first frequency-dependent gain factor ($G_{b,i}$) and to provide a plurality of attenuated band-limited audio signals, and
   wherein the output limiter (2) is adapted to limit the signal level of each of the plurality of attenuated audio signals to a maximum signal level, wherein in particular the maximum signal level is individual for each frequency band, and to provide a plurality of band-limited limited audio signals, and wherein the second attenuator (7) is adapted to attenuate each of the band-limited limited audio signals by the corresponding second frequency-dependent gain factor ($G_{p,i}$) and to provide a plurality of further attenuated audio signals as input signals to the synthesis filter bank (9).

8. The hearing device of claim 7, wherein the acoustic shock controller (5) is adapted to determine a total frequency-dependent gain factor ($G_{a,i}$) as well as a first frequency-dependent gain distribution coefficient ($r_{b,i}$) and a second frequency-dependent gain distribution coefficient ($r_{p,i}$) for each frequency band, all in dependence of the shock detection information, and wherein the total frequency-dependent gain factor ($G_{a,i}$) is the product of the first and second frequency-dependent gain factors ($G_{b,i}$, $G_{p,i}$) for each frequency band, and the sum of the first frequency-dependent gain distribution coefficient ($r_{b,i}$) and the second frequency-dependent gain distribution coefficient ($r_{p,i}$) is a constant for each frequency band, and wherein the first frequency-dependent gain factor ($G_{b,i}$) is determined as the total frequency-dependent gain factor ($G_{a,i}$) multiplied by the first frequency-dependent gain distribution coefficient ($r_{b,i}$) and the second frequency-dependent gain factor ($G_{p,i}$) is determined as the total frequency-dependent gain factor ($G_{a,i}$) multiplied by the second frequency-dependent gain distribution coefficient ($r_{p,i}$) for each frequency band.

9. The hearing device of claim 7, wherein the acoustic shock controller (5) is adapted to adjust the first frequency-dependent gain factor ($G_{b,i}$) and the second frequency-dependent gain factor ($G_{p,i}$) in dependence of a frequency-dependent degree of saturation ($S_i$) of the band-limited limited audio signal for each frequency band, and wherein the acoustic shock controller (5) is in particular adapted to increase the first frequency-dependent gain factor ($G_{b,i}$) and to decrease the second frequency-dependent gain factor ($G_{p,i}$) when the frequency-dependent degree of saturation ($S_i$) decreases.

10. The hearing device of claim 5, wherein the acoustic shock controller (5) is adapted to adjust the first frequency-dependent gain factor ($G_{b,i}$) and the second frequency-dependent gain factor ($G_{p,i}$) for each frequency band in dependence of the type of the momentary acoustic environment (AE).

11. The hearing device of claim 6, wherein the acoustic shock controller (5) is adapted to adjust the first frequency-dependent gain factor ($G_{b,i}$) and the second frequency-dependent gain factor ($G_{p,i}$) for each frequency band in dependence of the type of the acoustic shock event.

12. The hearing device of claim 1, wherein the acoustic shock controller (5) is adapted to adjust the first gain factor ($G_b$) and the second gain factor ($G_p$), or alternatively the first frequency-dependent gain factor ($G_{b,i}$) and the second frequency-dependent gain factor ($G_{p,i}$) for each frequency band, or the total gain ($G_a$), or alternatively the total frequency-dependent gain ($G_{a,i}$) for each frequency band, in dependence of personal preferences (PP) of the user.

13. The hearing device of claim 12, wherein the hearing device further comprises a control element structured and configured to receive user inputs, and wherein the acoustic shock controller is adapted to adjust the personal preferences (PP) in dependence of the user inputs, and wherein in particular the hearing device is adapted to receive initial personal preferences (PP) from a fitting device.

14. The hearing device of claim 1, wherein the hearing device further comprises a transceiver adapted to transmit information to and to receive information from a second hearing device and intended to be worn at or at least partly within another ear of the user, wherein said information comprises at least one of the following:
the shock detection information;
the first gain factor ($G_b$) and/or the second gain factor ($G_p$);
the first frequency-dependent gain factor ($G_{b,i}$) and/or the second frequency-dependent gain factor ($G_{p,i}$) for one or more of the frequency bands;
the total gain factor ($G_a$) and/or the first gain distribution coefficient ($r_b$) and/or the second gain distribution coefficient ($r_p$);
the total frequency-dependent gain factor ($G_{a,i}$) and/or the first frequency-dependent gain distribution coefficient ($r_{b,i}$) and/or the second frequency-dependent gain distribution coefficient ($r_{p,i}$) for one or more of the frequency bands;
the type of the momentary acoustic environment (AE);
the type of the acoustic shock event,
wherein the acoustic shock controller (5) is adapted to apply the information received from the other hearing device to determine at least one of the following in the hearing device:
the shock detection information;
the first gain factor ($G_b$) and/or the second gain factor ($G_p$);
the first frequency-dependent gain factor ($G_{b,i}$) and/or the second frequency-dependent gain factor ($G_{p,i}$) for one or more of the frequency bands;
the total gain factor ($G_a$) and/or the first gain distribution coefficient ($r_b$) and/or the second gain distribution coefficient ($r_p$);
the total frequency-dependent gain factor ($G_{a,i}$) and/or the first frequency-dependent gain distribution coefficient ($r_{b,i}$) and/or the second frequency-dependent gain distribution coefficient ($r_{p,i}$) for one or more of the frequency bands;
the type of the momentary acoustic environment (AE);
the type of the acoustic shock event.

15. A method for acoustic shock control in a hearing device intended to be worn at or at least partly within an ear of a user of the hearing device, comprising the steps of:
a) receiving an audio signal and based thereupon providing an input audio signal;
b) detecting an acoustic shock event present in the input audio signal and providing shock detection information related to the acoustic shock event;
c) processing the input audio signal and providing a processed audio signal;
d) determining a first gain factor ($G_b$) and a second gain factor ($G_e$) in dependence of the shock detection information;
e) attenuating the processed audio signal by the first gain factor ($G_b$) and providing an attenuated audio signal;
f) limiting a signal level of the attenuated audio signal to a maximum signal level and providing a limited audio signal;
g) attenuating the limited audio signal by the second gain factor ($G_e$) and providing a further attenuated audio signal as an output audio signal; and
h) outputting the output audio signal to the user.

16. The method of claim 15, further comprising the steps of:
decomposing the input audio signal into a plurality of band-limited input audio signals each associated with a corresponding frequency band; and
combining or composing a plurality of band-limited output audio signals into a single output audio signal,
wherein steps c) to g) are performed individually for each frequency band.

17. The method of claim 15, further comprising the steps of:
transmitting information to a second hearing device intended to be worn at or at least partly within another ear of the user;
receiving information from the second hearing device,
wherein said information comprises at least one of the following:
the shock detection information;
the first gain factor ($G_b$) and/or the second gain factor ($G_p$);

the first frequency-dependent gain factor ($G_{b,i}$) and/or the second frequency-dependent gain factor ($G_{p,i}$) for one or more of the frequency bands;

the total gain factor ($G_a$) and/or the first gain distribution coefficient ($r_b$) and/or the second gain distribution coefficient ($r_p$);

the total frequency-dependent gain factor ($G_{a,i}$) and/or the first frequency-dependent gain distribution coefficient ($r_{b,i}$) and/or the second frequency-dependent gain distribution coefficient ($r_{p,i}$) for one or more of the frequency bands;

the type of the momentary acoustic environment (AE);

the type of the acoustic shock event, and wherein the information received from the other hearing device is employed for determining at least one of the following in the hearing device:

the shock detection information;

the first gain factor ($G_b$) and/or the second gain factor ($G_p$);

the first frequency-dependent gain factor ($G_{b,i}$) and/or the second frequency-dependent gain factor ($G_{p,i}$) for one or more of the frequency bands;

the total gain factor ($G_a$) and/or the first gain distribution coefficient ($r_b$) and/or the second gain distribution coefficient ($r_p$);

the total frequency-dependent gain factor ($G_{a,i}$) and/or the first frequency-dependent gain distribution coefficient ($r_{b,i}$) and/or the second frequency-dependent gain distribution coefficient ($r_{p,i}$) for one or more of the frequency bands;

the type of the momentary acoustic environment (AE);

the type of the acoustic shock event.

18. The hearing device of claim 1, wherein the acoustic shock controller (5) is connected between the acoustic shock detector (4) and the output limiter (2).

19. The hearing device of claim 1, wherein the audio signal is attenuated by the first gain factor ($G_b$) before the output limiter (2) and by the second gain factor (GO after the output limiter (2).

* * * * *

UNITED STATES PATENT AND TRADEMARK OFFICE
CERTIFICATE OF CORRECTION

| | | |
|---|---|---|
| PATENT NO. | : 11,128,946 B2 | Page 1 of 1 |
| APPLICATION NO. | : 16/477587 | |
| DATED | : September 21, 2021 | |
| INVENTOR(S) | : Luo et al. | |

It is certified that error appears in the above-identified patent and that said Letters Patent is hereby corrected as shown below:

In the Claims

Claim 15, Column 14, Line 37: please remove the phrase "factor ($G_e$) in dependence of" and replace it with -- factor ($G_p$) in dependence of --

Claim 15, Column 14, Line 45: please remove the phrase "factor ($G_e$) and providing" and replace it with -- factor ($G_p$) and providing --

Claim 19, Column 16, Line 19: please remove the phrase "gain factor (GO after the" and replace it with -- gain factor ($G_p$) after the --

Signed and Sealed this
Twenty-first Day of February, 2023

Katherine Kelly Vidal
*Director of the United States Patent and Trademark Office*